United States Patent
Chan et al.

(10) Patent No.: US 9,407,252 B2
(45) Date of Patent: Aug. 2, 2016

(54) CURRENT LEAKAGE MITIGATION

(71) Applicant: Taiwan Semiconductor Manufacturing Company Limited, Hsin-Chu (TW)

(72) Inventors: Hao-chieh Chan, Hsinchu (TW); Tsung-Hsin Yu, Hsinchu (TW)

(73) Assignee: Taiwan Semiconductor Manufacturing Company Limited, Hsin-chu (TW)

( * ) Notice: Subject to any disclaimer, the term of this patent is extended or adjusted under 35 U.S.C. 154(b) by 140 days.

(21) Appl. No.: 14/079,755

(22) Filed: Nov. 14, 2013

(65) Prior Publication Data

US 2015/0130530 A1    May 14, 2015

(51) Int. Cl.
*H03K 17/687* (2006.01)
*H03K 17/16* (2006.01)

(52) U.S. Cl.
CPC .......... *H03K 17/162* (2013.01); *H03K 17/6872* (2013.01); *H03K 2217/0036* (2013.01)

(58) Field of Classification Search
CPC .............. H03K 17/162; H03K 17/687; H03K 17/6871; H03K 17/6872
USPC .......... 327/148, 158, 427, 434, 436, 437, 536
See application file for complete search history.

(56) References Cited

U.S. PATENT DOCUMENTS

| 5,825,640 | A  | * | 10/1998 | Quigley et al. | ................. 363/60 |
| 6,919,746 | B2 | * | 7/2005 | Suzuki | .......................... 327/157 |
| 2004/0130364 | A1 | * | 7/2004 | Suzuki | .......................... 327/157 |

* cited by examiner

*Primary Examiner* — William Hernandez
(74) *Attorney, Agent, or Firm* — Cooper Legal Group, LLC

(57) ABSTRACT

One or more circuits are provided wherein leakage current is mitigated. A circuit comprises a pad, a first transistor, a second transistor, a power leakage component and a data leakage component. The first transistor and the second transistor are respectively configured to control a voltage level at the pad. The first transistor is connected to the pad and to a first voltage source. The second transistor is connected to the pad and to a third voltage source. The power leakage component is connected between the first transistor and the pad. The data leakage component is connected between the second transistor and the pad. The power leakage component is configured to mitigate leakage current from the first transistor to the pad. The data leakage component is configured to mitigate leakage current from the pad to the second transistor.

20 Claims, 4 Drawing Sheets

CURRENT LEAKAGE MITIGATION

BACKGROUND

In electronic devices, a channel length affects a speed at which signals travel through the electronic devices. Generally, the shorter the channel length, the faster signals travel. In a transistor, however, the channel length also affects a magnitude of leakage current through the transistor. The shorter the channel length, the greater the leakage current that flows through the transistor when the transistor is deactivated. It is, at times, desirable to choose a very short channel length for very fast data transfer, but if the channel length is too short, the leakage current may be large enough to disrupt voltage levels at various nodes in a circuit within which the transistor is comprised.

DETAILED DESCRIPTION

Figure 1:
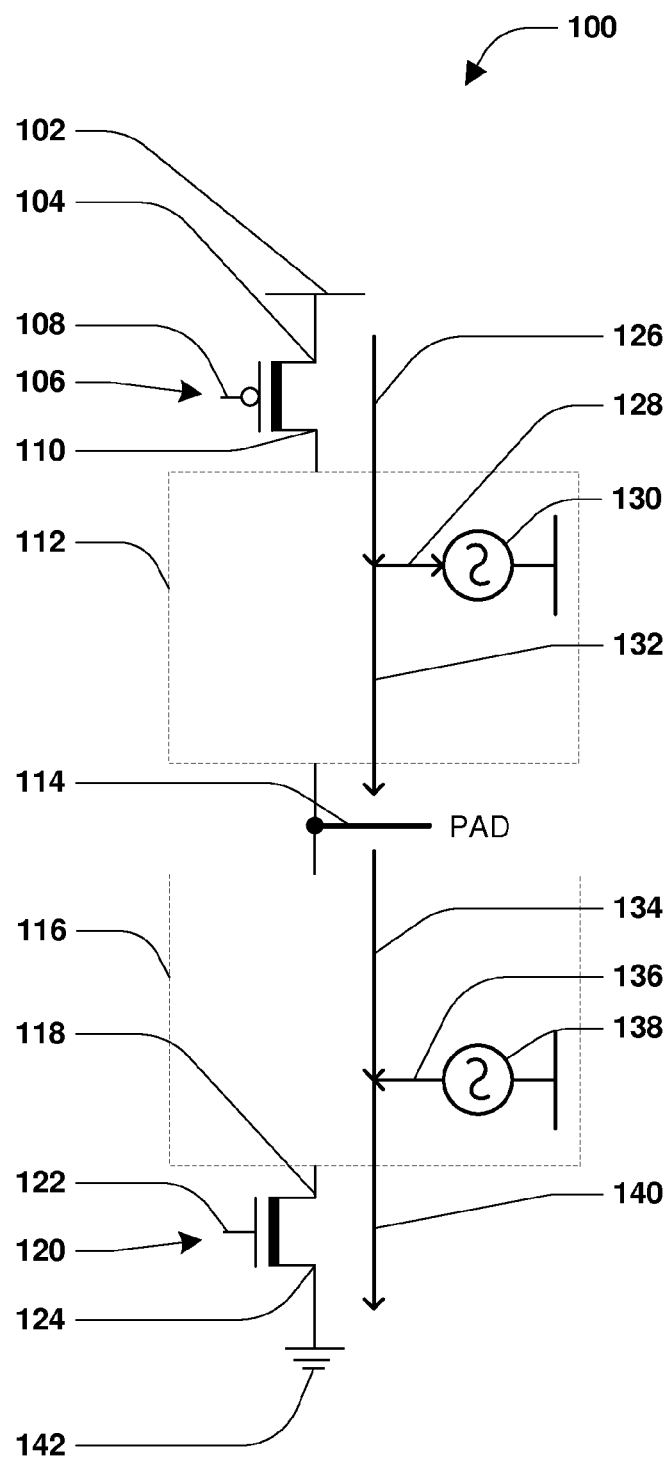
FIG. 1 is an illustration of a circuit, according to some embodiments.

Embodiments or examples, illustrated in the drawings are disclosed below using specific language. It will nevertheless be understood that the embodiments or examples are not intended to be limiting. Any alterations and modifications in the disclosed embodiments, and any further applications of the principles disclosed in this document are contemplated as would normally occur to one of ordinary skill in the pertinent art.

In some embodiments, a circuit is provided. In some embodiments, the circuit comprises a first transistor, a second transistor and a pad. The first transistor is connected to a first voltage source and to the pad. The second transistor is connected to a third voltage source and to the pad. The first transistor and the second transistor are configured to control a voltage level at the pad. When the first transistor is activated and the second transistor is deactivated, the voltage level at the pad is equal to a first voltage level, where the first voltage level is, in some embodiments, equal to or substantially equal to a voltage level at the first voltage source. When the first transistor is deactivated and the second transistor is activated, the voltage level at the pad is equal to a second voltage level, where the second voltage level is, in some embodiments, equal to or substantially equal to a voltage level at the third voltage source.

When the first transistor is deactivated and the second transistor is activated, a first voltage difference across the first transistor is substantially equal to the first voltage level. When the first transistor is activated and the second transistor is deactivated, a second voltage difference across the second transistor is substantially equal to the first voltage level. A magnitude of the first voltage difference affects a magnitude of a first leakage current that flows through the first transistor to the pad. In some embodiments, as the magnitude of the first voltage difference increases, the magnitude of the first leakage current increases. A magnitude of the second voltage difference affects a magnitude of a second leakage current that flows through the second transistor from the pad. In some embodiments, as the magnitude of the second voltage difference increases, the magnitude of the second leakage current increases.

In some embodiments, a power leakage component is connected to the circuit, between the first transistor and the pad. When the first transistor is deactivated, the power leakage component is configured to mitigate the effect of the first voltage difference on the first leakage current flowing to the pad. In some embodiments, a data leakage component is connected to the circuit, between the second transistor and the pad. When the second transistor is deactivated, the data leakage component is configured to mitigate the effect of the second voltage difference on the second leakage current flowing from the pad.

FIG. 1 is a schematic diagram illustrating a circuit 100, according to some embodiments. The circuit 100 comprises a first voltage source 102, a second voltage source 130, a third voltage source 142, a fourth voltage source 138, a first transistor 106, a second transistor 120 and a pad 114. In some embodiments, the first voltage source 102 and the fourth voltage source 138 respectively comprise 3.3 volts. In some embodiments, the second voltage source 130 and the third voltage source 142 respectively comprise ground. A source 104 of the first transistor 106 is connected to the first voltage source 102, and a drain 110 of the first transistor 106 is connected to the pad 114. The pad 114 is connected to a drain 118 of the second transistor 120, and a source 124 of the second transistor 120 is connected to the third voltage source 142.

The first transistor 106 and the second transistor 120 are configured to control a voltage level at the pad 114. When the first transistor 106 is activated and the second transistor 120 is deactivated, the voltage level at the pad 114 is equal to a first voltage level, where the first voltage level is, in some embodiments, equal to or substantially equal to a voltage level at the first voltage source 102. When the first transistor 106 is deactivated and the second transistor 120 is activated, the voltage level at the pad 114 is equal to a second voltage level, where the second voltage level is, in some embodiments, equal to or substantially equal to a voltage level at the third voltage source 142. The state of the first transistor 106 and the state of the second transistor 120 are respectively controlled by an enable signal. In some embodiments, the enable signal is connected to a gate 108 of the first transistor 106 and to a gate 122 of the second transistor 120. In some embodiments, when a voltage level of the enable signal is at a third voltage level, the first transistor 106 is deactivated and the second transistor 120 is activated. In some embodiments, when a voltage level of the enable signal is at a fourth voltage level, the first transistor 106 is activated and the second transistor 120 is deactivated.

When the first transistor 106 is deactivated and the second transistor 120 is activated, a first voltage difference across the first transistor 106 is substantially equal to the first voltage level. When the first transistor 106 is activated and the second transistor 120 is deactivated, a second voltage difference across the second transistor 120 is substantially equal to the first voltage level. A magnitude of the first voltage difference affects a magnitude of a first leakage current 126 that flows through the first transistor 106 to the pad 114. In some embodiments, as the magnitude of the first voltage difference increases, the magnitude of the first leakage current 126 also increases. A magnitude of the second voltage difference affects a magnitude of a second leakage current 140 that flows through the second transistor 120 from the pad 114. In some embodiments, as the magnitude of the second voltage difference increases, the magnitude of the second leakage current 140 also increases.

In some embodiments, a power leakage component 112 is connected between the first transistor 106 and the pad 114. When the first transistor 106 is deactivated, and thus the first voltage difference exists across the first transistor 106, the power leakage component 112 is configured to allow a first portion 132 of the first leakage current 126 to flow to the pad while directing a second portion 128 of the first leakage current 126 away from the pad 114, to the second voltage source 130. The second portion 128 of the first leakage current 126 is greater than the first portion 132 of the first leakage current 126. This results in less leakage current flowing to the pad 114 than in an embodiment that does not comprise the power leakage component 112. In some embodiments the first portion 132 of the first leakage current 126 is equal to or substantially equal to zero when the first transistor 106 is deactivated.

In some embodiments, a data leakage component 116 is connected between the second transistor 120 and the pad 114. When the second transistor 120 is deactivated, and thus the second voltage difference exists across the second transistor 120, the data leakage component 116 is configured to allow a first portion 134 of the second leakage current 140 to flow from the pad 114. The data leakage component 116 directs a second portion 136 of the second leakage current from the fourth voltage source 138 to the drain 118. The second portion 136 of the second leakage current 140 is greater than the first portion 134 of the second leakage current 140. Given the second voltage difference across the second transistor 120, at least some leakage current occurs through the second transistor 120 and thus the second leakage current 140 is greater than zero. Accordingly, in the absence of the second portion 136 of the second leakage current 140, a greater amount of current would be drawn from the pad, thus destabilizing conditions at the pad 114. Thus, supplying the second portion 136 of the second leakage current 140 from the fourth voltage source 138 allows the value of the first portion 134 of the second leakage current 140 to remain relatively low thus mitigating destabilization at the pad 114. In some embodiments, the first portion 134 of the second leakage current 140 is equal to or substantially equal to zero when the second transistor 120 is deactivated.

Figure 2:
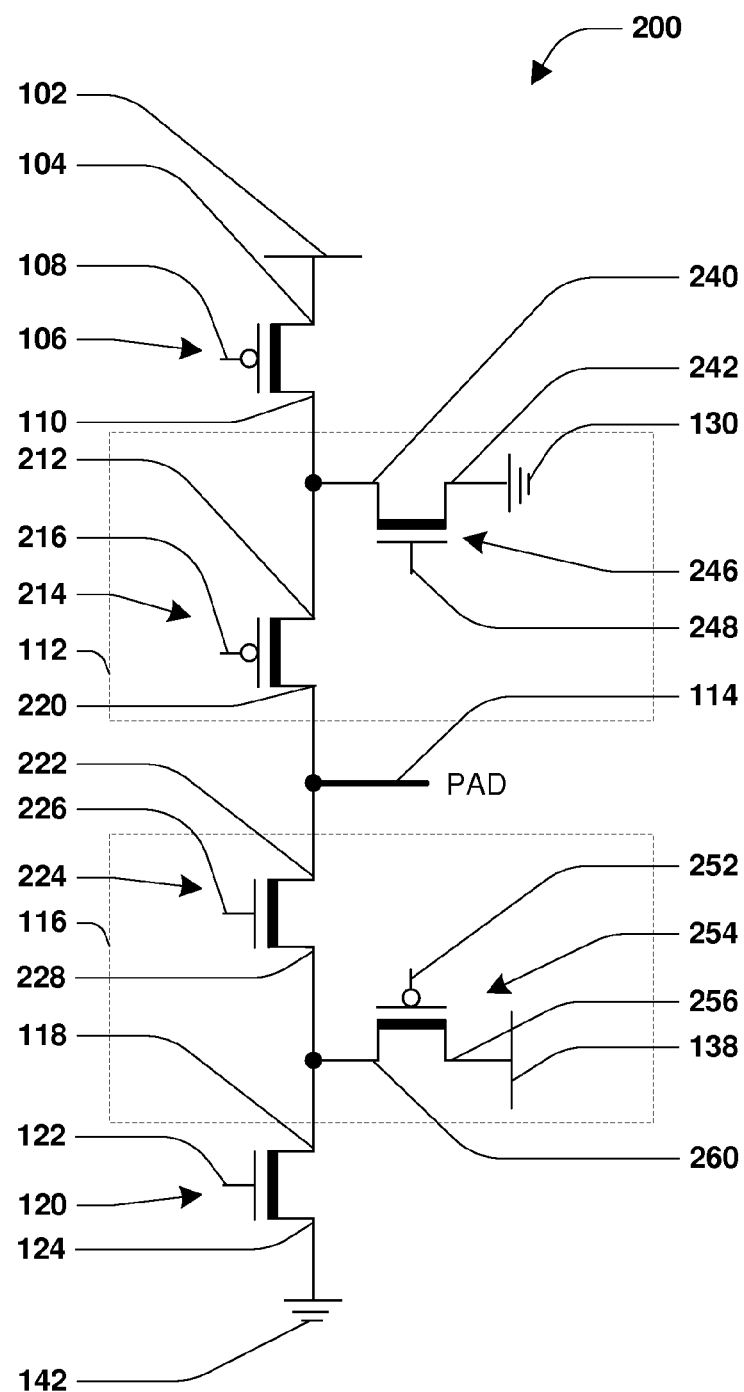
FIG. 2 is an illustration of a circuit, according to some embodiments.

FIG. 2 is a schematic diagram illustrating a circuit 200, according to some embodiments. The circuit 200 comprises the first voltage source 102, the second voltage source 130, the third voltage source 142, the fourth voltage source 138, the first transistor 106, the second transistor 120, the power leakage component 112, the data leakage component 116 and the pad 114. The first voltage source 102 is connected to the source 104 of the first transistor 106. The drain 110 of the first transistor 106 is connected to the power leakage component 112 which comprises a first electronic component and a second electronic component. In an embodiment, the first electronic component comprises a third transistor 246. A drain 240 of the third transistor 246 is connected to the drain 110, and a source 242 of the third transistor 246 is connected to the second voltage source 130. The drain 240 is also connected to the second electronic component. In an embodiment, the second electronic component comprises a fourth transistor 214. A source 212 of the fourth transistor 214 is connected to the drain 110 and to the drain 240, and a drain 220 of the fourth transistor 214 is connected to the pad 114.

The pad 114 is connected to the data leakage component 116 which comprises a third electronic component and a fourth electronic component. In an embodiment, the third electronic component comprises a fifth transistor 224. A drain 222 of the fifth transistor 224 is connected to the pad 114, and a source 228 of the fifth transistor is connected to the fourth electronic component. In an embodiment, the fourth electronic component comprises a sixth transistor 254. A source 256 of the sixth transistor 254 is connected to the fourth voltage source 138, and a drain 260 of the sixth transistor 254 is connected to the source 228 and to the drain 118. The source 124 is connected to the third voltage source 142.

In some embodiments, an enable signal is connected to the circuit. In some embodiments, the gate 108, the gate 122, a gate 248 of the third transistor 246, a gate 216 of the fourth transistor 214, a gate 226 of the fifth transistor 224 and a gate 252 of the sixth transistor 254 are respectively connected to the enable signal. The enable signal is configured to control the state of the transistors in the circuit. When a voltage level of the enable signal is at the third voltage level, the first transistor 106, the fourth transistor 214 and the sixth transistor 254 are respectively deactivated, and the second transistor 120, the third transistor 246 and the fifth transistor 224 are respectively activated. When the voltage level of the enable signal is at the fourth voltage level, the first transistor 106, the fourth transistor 214 and the sixth transistor 254 are respectively activated, and the second transistor 120, the third transistor 246 and the fifth transistor 224 are respectively deactivated.

When the voltage level of the enable signal is at the third voltage level, a voltage level equal to or substantially equal to that of the third voltage source 142 is applied to the pad 114. If the power leakage component 112 is not included in the circuit, then the first voltage difference between the source 104 and the drain 110 will be substantially equal to a magnitude of the difference between a voltage level at the first voltage source 102 and a voltage level at the third voltage source 142. In some embodiments, the first voltage difference is substantially equal to 3.3 volts and the transistors in the circuit 200 respectively have a voltage rating of 3.3 volts. The magnitude of the first voltage difference affects a magnitude of a first leakage current that flows from the first voltage source 102 to the drain 110. In some embodiments, as the magnitude of the first voltage difference increases, the magnitude of the first leakage current also increases. In some embodiments, the magnitude of the first voltage difference is large enough to cause a first leakage current that is large enough to disrupt a voltage level at the pad 114. In order to decrease the magnitude of the first leakage current entering the pad 114, the power leakage component 112 is added. Because the voltage level of the enable signal is at the third voltage level, the third transistor 246 is activated, and the drain 110 is thereby connected to the second voltage source 130. At this time, when the voltage level of the enable signal is at the third voltage level, the fourth transistor 214 is deactivated so that a current that is passing from the first transistor 106 to the pad 114 is mitigated. At this time, when the voltage level of the enable signal is at the third voltage level, the second voltage source 130 is applied to the source 212, and the third voltage source 142 is applied to the drain 220. In some embodiments, a voltage level of the second voltage source 130 is substantially equal to the voltage level of the third voltage source 142. In an embodiment, the second voltage source 130 and the third voltage source 142 respectively comprise ground. In this way, a voltage difference between the source 212 and the drain 220 will be substantially equal to zero. In this way, a leakage current entering the pad 114 from the drain 210 will be substantially mitigated, and thus will cause few to no disruptions to the voltage level at the pad 114.

When the voltage level of the enable signal is at the fourth voltage level, the first voltage source 102 is applied to the pad 114. If the data leakage component 116 is not included in the circuit, then the second voltage difference between the drain 118 and the source 124 of the second transistor 120 will be substantially equal to a magnitude of the difference between the voltage level at the first voltage source 102 and the voltage level at the third voltage source 142. The magnitude of the second voltage difference affects a second leakage current that flows from the drain 118 to the third voltage source 142. In some embodiments, as the magnitude of the second voltage difference increases, the magnitude of the second leakage current also increases. In some embodiments, the magnitude of the second voltage difference is large enough to cause a second leakage current that is large enough to disrupt a voltage level at the pad 114. In order to decrease the magnitude of the second leakage current leaving the pad 114, the data leakage component 116 is added. Because the voltage level of the enable signal is at the fourth voltage level, the sixth transistor 254 is activated, and the drain 260 is thereby connected to the fourth voltage source 138. At this time, the fifth transistor 224 is deactivated so that a current cannot pass from the pad 114 to the second transistor 120, and so that a current cannot pass from the second transistor 120 to the pad 114. At this time, when the voltage level of the enable signal is at the fourth voltage level, the fourth voltage source 138 is applied to the source 228, and the first voltage source 102 is applied to the drain 222. In some embodiments, a voltage level of the fourth voltage source 138 is substantially equal to the voltage level of the first voltage source 102. In this way, a voltage difference between the source 228 and the drain 222 will be substantially equal to zero. In this way, a leakage current leaving the pad 114 through the drain 222 will be substantially mitigated, and thus will cause few to no disruptions to the voltage level at the pad 114.

In some embodiments, the first transistor 106, the fourth transistor 214 and the sixth transistor 254 respectively comprise P-channel MOSFETs. In some embodiments, the second transistor 120, the third transistor 246 and the fifth transistor 224 respectively comprise N-channel MOSFETs.

Figure 3:
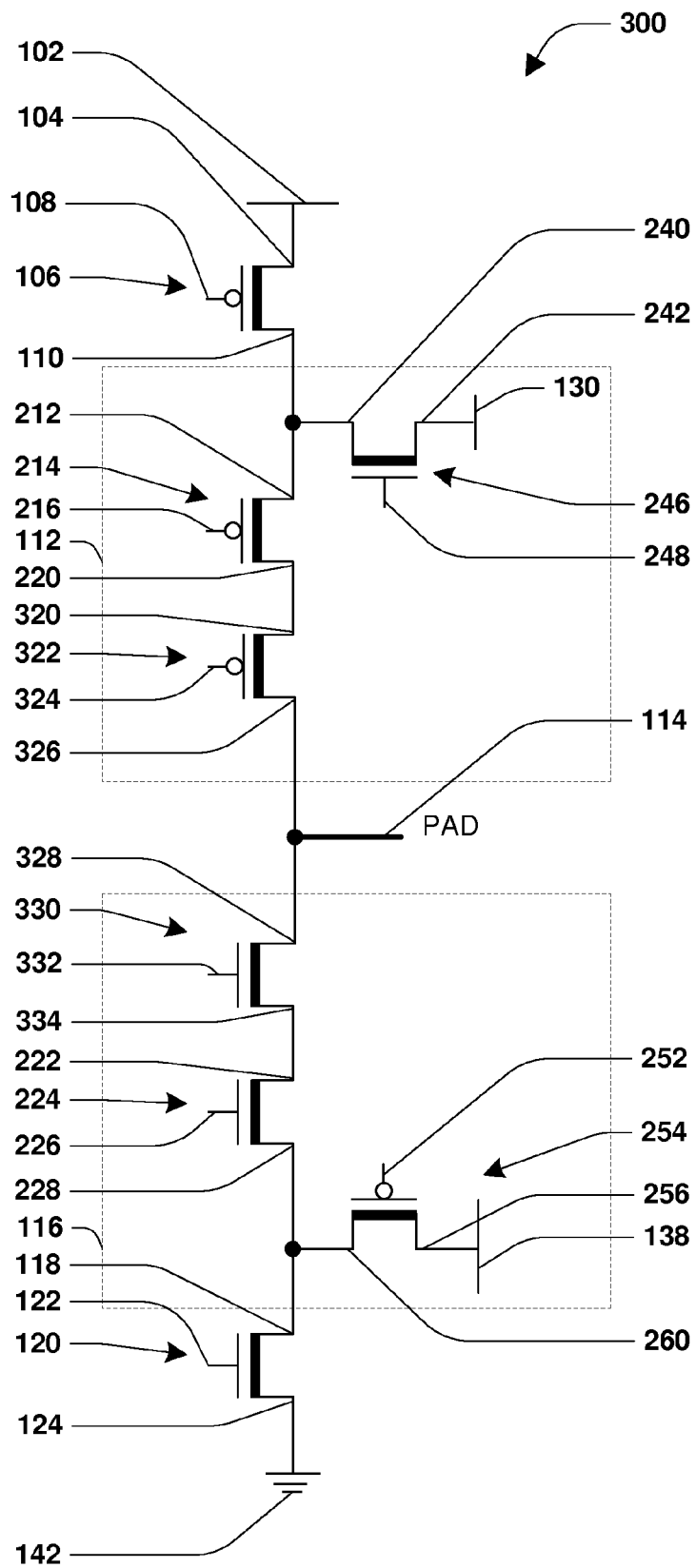
FIG. 3 is an illustration of a circuit, according to some embodiments.

FIG. 3 is a schematic diagram illustrating a circuit 300, according to some embodiments. The circuit 300 comprises the first voltage source 102, the second voltage source 130, the third voltage source 142, the fourth voltage source 138, the first transistor 106, the second transistor 120, the power leakage component 112, the data leakage component 116 and the pad 114. The power leakage component 112 comprises the third transistor 246, the fourth transistor 214, and a seventh transistor 322. The data leakage component 116 comprises the fifth transistor 224, the sixth transistor 254, and an eighth transistor 330. In some embodiments, components in the circuit 300 are rated for 1.8 volts, such as 1.8 volts across the different transistors. The first voltage source 102 is connected to the source 104. In some embodiments, the first voltage source 102 comprises 3.3 volts. The drain 110 is connected to the drain 240. The source 242 is connected to the second voltage source 130. In some embodiments, the second voltage source 130 comprises 1.8 volts. The drain 240 is connected to the source 212. The drain 220 is connected to a source 320 of the seventh transistor 322. A drain 326 of the seventh transistor 322 is connected to the pad 114. The pad 114 is connected to a drain 328 of the eighth transistor 330. A source 334 of the eighth transistor 330 is connected to the drain 222. The source 228 is connected to the drain 260. The source 256 is connected to the fourth voltage source 138. In some embodiments, the fourth voltage source 138 comprises 1.8 volts. The drain 260 is connected to the drain 118. The source 124 is connected to the third voltage source 142. In some embodiments, the third voltage source 142 comprises ground. In some embodiments, the circuit 300 operates as described with regard to circuits 100 and 200, but the seventh transistor 322 and the eighth transistor 330 allow the circuit to be used with the first voltage source 102 which provides 3.3 volts even though the transistors of the circuit 300 are rated for less than 3.3 volts such as 1.8 volts.

In some embodiments, the first transistor 106, the fourth transistor 214, the sixth transistor 254, and the seventh transistor 322 respectively comprise P-channel MOSFETs. In some embodiments, the second transistor 120, the third transistor 246, the fifth transistor 224 and the eighth transistor 330 respectively comprise N-channel MOSFETs.

Figure 4:
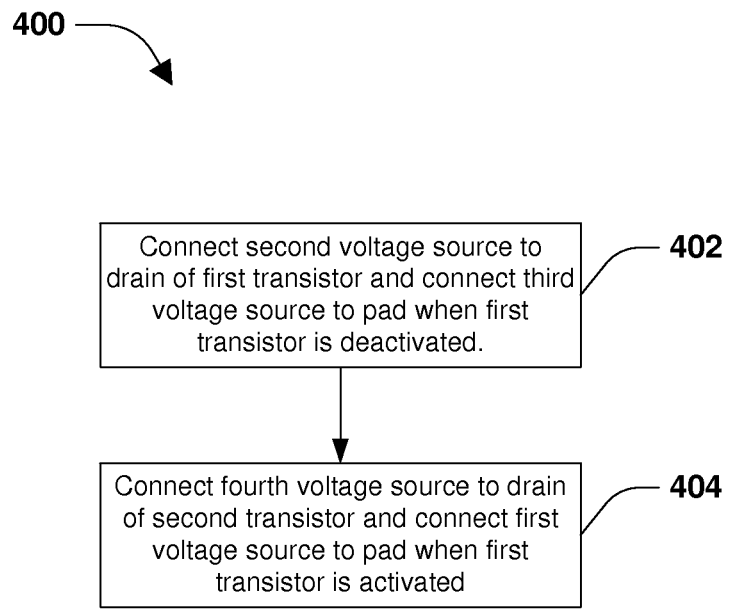
FIG. 4 is an illustration of a method, according to some embodiments.

A method 400 is illustrated in FIG. 4. In some embodiments, the method 400 is implemented with a circuit that comprises a pad, a first transistor and a second transistor. The pad is connected to a drain of the first transistor. The pad is also connected to a drain of the second transistor. A source of the first transistor is connected to a first voltage source. A source of the second transistor is connected to a third voltage source. When the first transistor is deactivated, at 402, a second voltage source is connected to the drain of the first transistor and the third voltage source is connected to the pad to mitigate leakage current from the first transistor to the pad. When the first transistor is activated, at 404, a fourth voltage source is connected to the drain of the second transistor and the first voltage source is connected to the pad to mitigate leakage current from the pad to the second transistor.

According to some embodiments, a circuit is provided. The circuit comprises a first transistor connected to a first voltage source and to a pad. The circuit also comprises a power leakage component configured to mitigate leakage current from the first transistor to the pad when the first transistor is deactivated.

According to some embodiments, a circuit is provided. The circuit comprises a first transistor connected to a first voltage source and to a pad. The circuit also comprises a second transistor connected to a third voltage source and to the pad. The circuit also comprises a data leakage component configured to mitigate leakage current from the pad to the second transistor when the first transistor is activated.

According to some embodiments, a method is provided. The method comprises connecting a second voltage source to a drain of a first transistor and connecting a third voltage source to a pad when the first transistor is deactivated to mitigate leakage current from the second transistor to the pad, where the pad is connected to the drain of the first transistor and where a source of the first transistor is connected to a first voltage source. The method also comprises connecting a fourth voltage source to a drain of a second transistor and connecting the first voltage source to the pad when the first transistor is activated to mitigate leakage current from the pad to the second transistor, where the pad is connected to the drain of the second transistor and where a source of the second transistor is connected to the third voltage source.

According to some embodiments, a circuit is provided. The circuit comprises a first transistor connected to a pad. The circuit also comprises a second transistor connected to the pad. The circuit comprises a power leakage component configured to mitigate leakage current from the first transistor to the pad when the first transistor is deactivated. The circuit also comprises a data leakage component configured to mitigate current from the pad to the second transistor when the first transistor is activated.

Although the subject matter has been described in language specific to structural features and/or methodological acts, it is to be understood that the subject matter of the appended claims is not necessarily limited to the specific features or acts described above. Rather, the specific features and acts described above are disclosed as example forms of implementing at least some of the claims.

Various operations of embodiments are provided herein. The order in which some or all of the operations are described should not be construed as to imply that these operations are necessarily order dependent. Alternative ordering will be appreciated. Further, it will be understood that not all operations are necessarily present in each embodiment provided herein. Also, it will be understood that not all operations are necessary in some embodiments.

Further, unless specified otherwise, "first," "second," or the like are not intended to imply a temporal aspect, a spatial aspect, an ordering, etc. Rather, such terms are merely used as identifiers, names, etc. for features, elements, items, etc. For example, a first channel and a second channel generally correspond to channel A and channel B or two different or identical channels or the same channel.

It will be appreciated that layers, features, elements, etc. depicted herein are illustrated with particular dimensions relative to one another, such as structural dimensions and/or orientations, for example, for purposes of simplicity and ease of understanding and that actual dimensions of the same differ substantially from that illustrated herein, in some embodiments.

Moreover, "exemplary" is used herein to mean serving as an example, instance, illustration, etc., and not necessarily as advantageous. As used in this application, "or" is intended to mean an inclusive "or" rather than an exclusive "or". In addition, "a" and "an" as used in this application are generally be construed to mean "one or more" unless specified otherwise or clear from context to be directed to a singular form. Also, at least one of A and B and/or the like generally means A or B or both A and B. Furthermore, to the extent that "includes", "having", "has", "with", or variants thereof are used in either the detailed description or the claims, such terms are intended to be inclusive in a manner similar to the term "comprising".

Also, although the disclosure has been shown and described with respect to one or more implementations, equivalent alterations and modifications will occur to others skilled in the art based upon a reading and understanding of this specification and the annexed drawings. The disclosure includes all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure. In addition, while a particular feature of the disclosure may have been disclosed with respect to only one of several implementations, such feature may be combined with one or more other features of the other implementations as may be desired and advantageous for any given or particular application.

What is claimed is:

1. A circuit, comprising:
   a first transistor connected to a first voltage source and to a pad;
   a second transistor connected to a second voltage source different than the first voltage source;
   a third transistor connected between the first transistor and the pad and connected between the second transistor and the pad;
   a node defined by at least two of a first gate of the first transistor, a second gate of the second transistor, or a third gate of the third transistors;
   a fourth transistor connected to the pad and to a third voltage source; and
   a data leakage component configured to mitigate leakage current from the pad to the fourth transistor when the first transistor is activated.

2. The circuit of claim 1, the node defined by the first gate of the first transistor, the second gate of the second transistor, and the third gate of the third transistor.

3. The circuit of claim 1, the first transistor and the third transistor corresponding to a first-type transistor and the second transistor corresponding to a second-type transistor.

4. The circuit of claim 3, the first-type transistor being a p-type transistor and the second-type transistor being an n-type transistor.

5. The circuit of claim 1, the node defined by a fourth gate of the fourth transistor.

6. The circuit of claim 1, the data leakage component comprising:
   a first electronic component connected to the pad and to a drain of the fourth transistor.

7. The circuit of claim 6, the data leakage component comprising:
   a second electronic component connected to the drain of the fourth transistor and to a fourth voltage source.

8. The circuit of claim 7, the first electronic component configured to connect the third voltage source to the pad when the fourth transistor is activated and the second electronic component configured to connect the fourth voltage source to a drain of the fourth transistor when the first transistor is activated.

9. A circuit, comprising:
   a first transistor connected to a first voltage source and to a pad;
   a second transistor connected to a second voltage source and to the pad;
   a power leakage component connected between the first transistor and the pad and connected between a third voltage source and the pad, the power leakage component configured to mitigate leakage current from the first transistor to the pad when the first transistor is deactivated; and
   a data leakage component connected between the second transistor and the pad and connected between a fourth voltage source and the pad, the data leakage component configured to mitigate leakage current from the pad to the second transistor when the first transistor is activated, wherein:
      a voltage level applied to the power leakage component by the third voltage source and a voltage level applied to the data leakage component by the fourth voltage source are substantially equal.

10. The circuit of claim 9, wherein a voltage level applied to the first transistor by the first voltage source is about two times greater than the voltage level applied to the power leakage component by the third voltage source.

11. The circuit of claim 9, the power leakage component comprising:
    a third transistor connected to a drain of the first transistor and to the third voltage source.

12. The circuit of claim 11, the power leakage component comprising:
    a fourth transistor connected to the drain of the first transistor and to the pad.

13. The circuit of claim 12, the third transistor configured to connect the third voltage source to the drain of the first transistor when the first transistor is deactivated and the fourth transistor configured to connect the first voltage source to the pad when the first transistor is activated.

14. The circuit of claim 13, the data leakage component comprising:
a fifth transistor connected to the pad and to a drain of the second transistor.

15. The circuit of claim 14, the data leakage component comprising:
a sixth transistor connected to the drain of the second transistor and to the fourth voltage source.

16. The circuit of claim 15, the fifth transistor configured to connect the second voltage source to the pad when the first transistor is deactivated and the second transistor is activated and the sixth transistor configured to connect the fourth voltage source to a drain of the second transistor and to a source of the fifth transistor when the first transistor is activated.

17. The circuit of claim 16, the first transistor, the fourth transistor and the sixth transistor comprising PMOS transistors, and the second transistor, the third transistor and the fifth transistor comprising NMOS transistors.

18. The circuit of claim 9, wherein:
a voltage level applied to the first transistor by the first voltage source is greater than the voltage level applied to the power leakage component by the third voltage source; and
a voltage level applied to second transistor by the second voltage source is less than the voltage level applied to the data leakage component by the fourth voltage source.

19. A method, comprising:
applying a first voltage to an enable signal that is supplied to a first gate of a first transistor, a second gate of a second transistor, and a third gate of a third transistor, wherein the first voltage:
deactivates the first transistor,
deactivates the second transistor to disconnect a source/drain of the first transistor from a pad, and
activates the third transistor to connect a first voltage source to the source/drain of the first transistor; and
applying a second voltage to the enable signal, wherein the second voltage:
activates the first transistor and the second transistor to connect a second voltage source to the pad, and
deactivates the third transistor to disconnect the first voltage source from the source/drain of the first transistor.

20. The method of claim 19, wherein the enable signal is applied to a fourth gate of a fourth transistor and the first voltage activates the fourth transistor to connect a third voltage source to the pad.

* * * * *